(12) United States Patent
Koyanagi

(10) Patent No.: US 12,457,813 B2
(45) Date of Patent: Oct. 28, 2025

(54) SEMICONDUCTOR DEVICE AND IMAGING DEVICE

(71) Applicant: Panasonic Intellectual Property Management Co., Ltd., Osaka (JP)

(72) Inventor: Takahiro Koyanagi, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 463 days.

(21) Appl. No.: 18/297,677

(22) Filed: Apr. 10, 2023

(65) Prior Publication Data

US 2023/0261012 A1 Aug. 17, 2023

Related U.S. Application Data

(63) Continuation of application No. PCT/JP2021/036368, filed on Oct. 1, 2021.

(30) Foreign Application Priority Data

Nov. 10, 2020 (JP) .................................. 2020-187527

(51) Int. Cl.
  *H10F 39/00* (2025.01)
  *H01L 21/768* (2006.01)
  (Continued)

(52) U.S. Cl.
  CPC ......... *H10F 39/803* (2025.01); *H01L 21/768* (2013.01); *H10D 1/042* (2025.01);
  (Continued)

(58) Field of Classification Search
  CPC .. H10F 39/802; H10F 39/803; H10F 39/8033; H10F 39/8037; H10F 39/12; H10F 39/811; H10F 39/812; H10F 39/807; H10F 39/014; H10F 39/18; H10F 39/018; H10F 37/18; H10F 19/50; H04N 25/76; G02F 1/136213; H10D 1/042; H10D 1/68;
  (Continued)

(56) References Cited

U.S. PATENT DOCUMENTS

2004/0056324 A1  3/2004  Ning et al.
2006/0289917 A1 12/2006  Fujiwara et al.
(Continued)

FOREIGN PATENT DOCUMENTS

JP  2006-500772  1/2006
JP  2007-005719  1/2007
(Continued)

OTHER PUBLICATIONS

International Search Report of PCT application No. PCT/JP2021/036368 dated Nov. 22, 2021.

*Primary Examiner* — Jose R Diaz
(74) *Attorney, Agent, or Firm* — Rimon P.C.

(57) ABSTRACT

A semiconductor device includes: a first capacitor element that includes a first electrode, a second electrode, and a dielectric layer positioned between the first electrode and the second electrode; and a second capacitor element that includes a third electrode and an insulating layer positioned between the second electrode and the third electrode. The first capacitor element includes at least one first trench portion.

16 Claims, 10 Drawing Sheets

(51) Int. Cl.
  *H10D 1/00* (2025.01)
  *H10D 1/68* (2025.01)
  *H10F 39/12* (2025.01)

(52) U.S. Cl.
  CPC ............ *H10D 1/043* (2025.01); *H10D 1/692* (2025.01); *H10D 1/716* (2025.01); *H10F 39/12* (2025.01); *H10F 39/811* (2025.01)

(58) Field of Classification Search
  CPC ........ H10D 1/692; H10D 1/716; H10D 1/047; H10D 1/665; H01L 23/5223
  See application file for complete search history.

(56) References Cited

U.S. PATENT DOCUMENTS

| | | |
|---|---|---|
| 2009/0230449 A1 | 9/2009 | Sakaguchi et al. |
| 2019/0096986 A1 | 3/2019 | Hsu et al. |
| 2019/0252488 A1 | 8/2019 | Koyanagi et al. |
| 2020/0389608 A1* | 12/2020 | Baek .................... H04N 25/778 |
| 2021/0013253 A1 | 1/2021 | Takase et al. |
| 2021/0057469 A1* | 2/2021 | Huang ................... H10D 1/043 |

FOREIGN PATENT DOCUMENTS

| | | |
|---|---|---|
| JP | 2009-224565 | 10/2009 |
| JP | 2013-168548 | 8/2013 |
| JP | 2019-145790 | 8/2019 |
| WO | 2019/193787 | 10/2019 |

\* cited by examiner

SEMICONDUCTOR DEVICE AND IMAGING DEVICE

BACKGROUND

1. Technical Field

The present disclosure relates to a semiconductor device and an imaging device.

2. Description of the Related Art

There has been a discussion of an attempt to increase the capacitance density per unit area of a capacitor element of a semiconductor integrated circuit, in order to improve the degree of integration. When the permittivity of a dielectric material is defined as $\varepsilon$, the permittivity of a vacuum is defined as $\varepsilon_0$, the dielectric film thickness is defined as t, and the electrode area is defined as S, a capacitance C of a capacitor element is represented as $C=(\varepsilon \times \varepsilon_0 \times S)/t$. That is, the capacitance density can be improved by enhancing the permittivity $\varepsilon$ of the dielectric material, reducing the dielectric film thickness t, and increasing the electrode area S by increasing the surface area using a three-dimensional structure (see Japanese Unexamined Patent Application Publication No. 2019-145790, for example), electrically connecting a plurality of capacitor elements in parallel with each other (see U.S. Patent Application Publication No. 2019/0096986, for example), etc. On the other hand, the withstand voltage characteristics can be improved and a leakage current can be reduced by increasing the dielectric film thickness t, using a low-permittivity material with a wide band gap, electrically connecting a plurality of capacitor elements in series with each other, etc.

SUMMARY

In one general aspect, the techniques disclosed here feature a semiconductor device including: a first capacitor element that includes a first electrode, a second electrode, and a dielectric layer positioned between the first electrode and the second electrode; and a second capacitor element that includes a third electrode and an insulating layer positioned between the second electrode and the third electrode. The first capacitor element includes at least one first trench portion. The first electrode, the second electrode, and the third electrode are stacked on each other in this order. At least a part of the first electrode, at least a part of the second electrode, and at least a part of the third electrode overlap each other in a plan view. The dielectric layer includes a first non-overlapping portion that does not overlap the first electrode in the plan view. The insulating layer includes a second non-overlapping portion that does not overlap the second electrode in the plan view. The first non-overlapping portion is positioned at the same height as the second non-overlapping portion in a thickness direction of the semiconductor device.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

Figure 1:
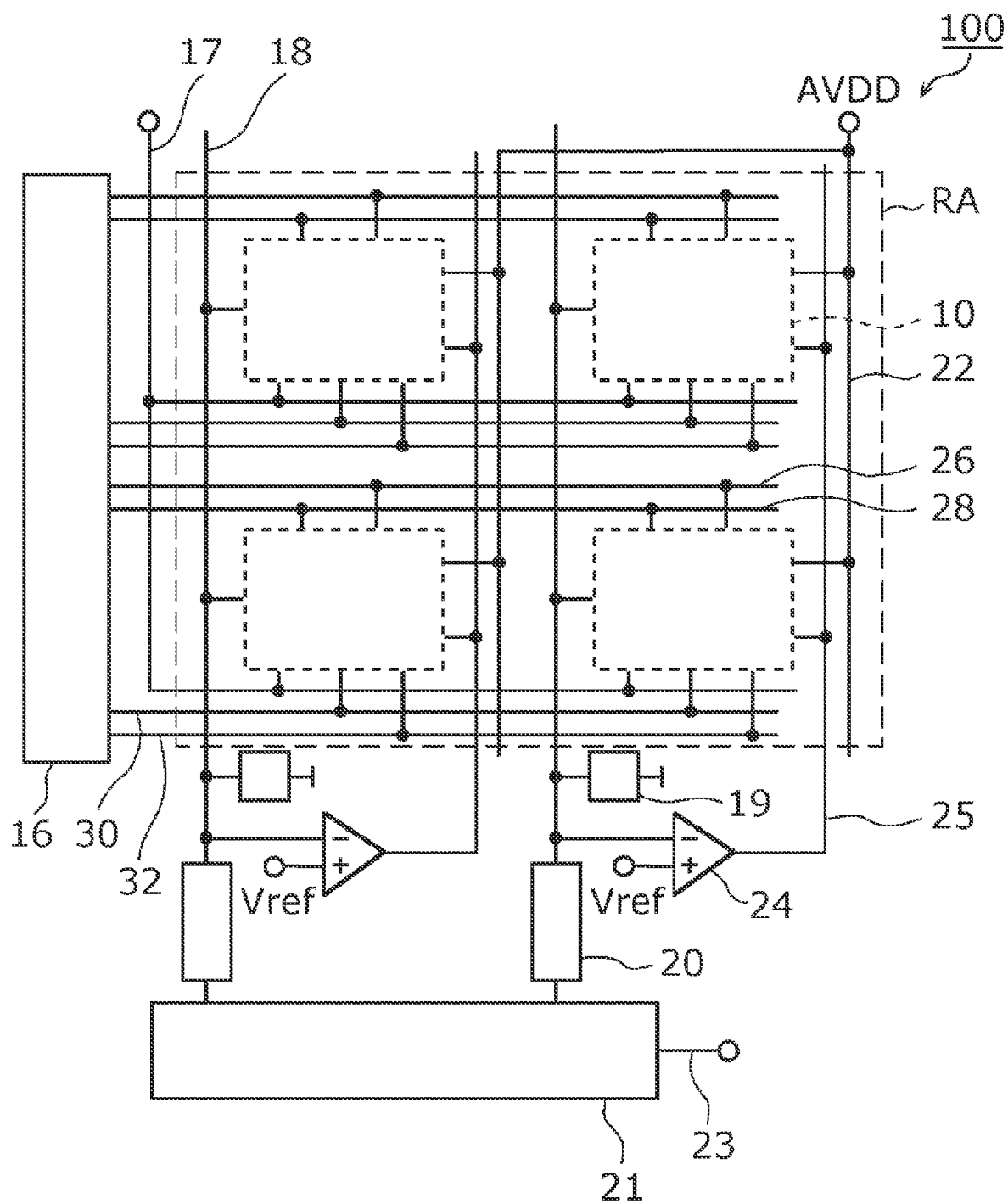
FIG. 1 illustrates an example of the circuit configuration of an imaging device according to an embodiment.

DETAILED DESCRIPTIONS (Underlying Knowledge Forming Basis of the Present Disclosure)

The inventor has found that the following problems are caused for the related art described in the "Description of the Related Art".

Japanese Unexamined Patent Application Publication No. 2019-145790 discloses a technique of increasing the capacitance density per unit area by reducing the dielectric film thickness by improving the withstand voltage of a capacitor element that includes a trench structure. However, the capacitance density of a capacitor element is preferably high for image sensor use, for example, and the capacitance density of a capacitor element may be insufficient for purposes such as downsizing pixels of an image sensor, achieving high saturation, and improving the dynamic range.

U.S. Patent Application Publication No. 2019/0096986 discloses a technique of increasing the capacitance density of capacitor elements by stacking and connecting planar capacitor elements in series with each other. However, planar capacitor elements that do not include a trench structure have a low capacitance density.

In view of such issues of the related art, there is a desire for a capacitor element that can improve the capacitance density, reduce a leakage current, etc. in an easily changeable manner in accordance with the usage. One non-limiting and exemplary embodiment provides a semiconductor device and an imaging device that include a capacitor element that can exhibit good characteristics in accordance with the usage.

An aspect of the present disclosure provides a semiconductor device including: a first capacitor element that includes a first electrode, a second electrode, and a dielectric layer positioned between the first electrode and the second electrode; and a second capacitor element that includes a third electrode and an insulating layer positioned between the second electrode and the third electrode. The first capacitor element includes at least one first trench portion. The first electrode, the second electrode, and the third electrode are stacked on each other in this order. At least a part of the first electrode, at least a part of the second electrode, and at least a part of the third electrode overlap each other in a plan view. The dielectric layer includes a first non-overlapping portion that does not overlap the first electrode in the plan view. The insulating layer includes a second non-overlapping portion that does not overlap the second electrode in the plan view. The first non-overlapping portion is positioned at the same height as the second non-overlapping portion in a thickness direction of the semiconductor device.

Consequently, the two capacitor elements can be caused to exhibit good characteristics in accordance with the usage, by varying the electrical connection among the first electrode, the second electrode, and the third electrode. For example, a semiconductor device that includes capacitor elements with a high capacitance density per unit area can be provided by connecting the first capacitor element, which includes a trench portion, and the second capacitor element, which is different from the first capacitor element, in parallel with each other. Meanwhile, a semiconductor device that includes capacitor elements with good leakage current characteristics can be provided by connecting the first capacitor element, which includes a trench portion, and the second capacitor element in series with each other. Consequently, it is possible to provide a semiconductor device with a high degree of freedom in design that enables selecting one of series connection and parallel connection.

With a part of the dielectric layer and a part of the insulating layer positioned at the same height in the thickness direction of the semiconductor device, a part of the second electrode provided above the part of the dielectric layer and a part of the third electrode provided above the part of the insulating layer can also be at the same height. By making contact with the portions at the same height, respective contacts with the second electrode and the third electrode can be aligned in height with each other to make good contact.

In U.S. Patent Application Publication No. 2019/0096986, the stacked structure of two capacitor elements includes a first electrode formed above a substrate, a first dielectric layer formed on the first electrode, a second electrode formed on the first dielectric layer, a second dielectric layer formed on the second electrode, and a third electrode formed on the second dielectric layer. The surface area of the third electrode is smaller than that of the second electrode, and the surface area of the second electrode is smaller than that of the first electrode. Therefore, at least one or more contact via wires to be electrical connected to an electrode are formed in the electrode on a dielectric that functions as a capacitor film. In order to form a contact via wire, an interlayer insulating film on the electrode and the electrode are etched through dry etching. This dry etching may cause etching damage to a dielectric layer immediately below the electrode, and increase a leakage current from the capacitor element and degrade withstand voltage characteristics.

In view of this respect, the semiconductor device according to the aspect of the present disclosure may further include a first contact plug connected to the first electrode in the at least one first trench portion, for example.

Consequently, contact with the first electrode can be made from the lower side. Therefore, etching damage is not caused to the dielectric layer positioned between the first electrode and the second electrode when a contact plug for the first electrode is formed. Hence, it is possible to suppress an increase in a leakage current from the capacitor elements, and to improve withstand voltage characteristics.

The first electrode may include two surfaces, and one of the two surfaces that is closer to the dielectric layer may be entirely covered by the dielectric layer, for example.

Consequently, a capacitor element that effectively uses the entire upper surface of the first electrode can be achieved. A short circuit between the first electrode and the second electrode can be suppressed.

Another aspect of the present disclosure provides a semiconductor device including: a first capacitor element that includes a first electrode, a second electrode, and a dielectric layer positioned between the first electrode and the second electrode; and a second capacitor element that includes a third electrode and an insulating layer positioned between the second electrode and the third electrode. The first capacitor element includes at least one first trench portion. The first electrode, the second electrode, and the third electrode are stacked on each other in this order. At least a part of the first electrode, at least a part of the second electrode, and at least a part of the third electrode overlap each other in a plan view. The second electrode includes a third non-overlapping portion that does not overlap either of the insulating layer and the third electrode in the plan view. The third electrode includes a fourth non-overlapping portion that does not overlap any of the first electrode, the dielectric layer, and the second electrode in the plan view. The third non-overlapping portion is positioned at the same height as the fourth non-overlapping portion in a thickness direction of the semiconductor device.

Consequently, contact can be made at the respective non-overlapping portions of the second electrode and the third electrode. Thus, an adverse effect on capacitance characteristics can be suppressed even if etching damage is caused to the dielectric layer or the insulating layer. Hence, it is possible to suppress an increase in a leakage current from the capacitor elements, and to improve withstand voltage characteristics.

The semiconductor device according to the aspect of the present disclosure may further include a second contact plug connected to the second electrode at the third non-overlapping portion, and a third contact plug connected to the third electrode at the fourth non-overlapping portion.

Consequently, contact is made at the respective non-overlapping portions of the second electrode and the third electrode. Thus, an adverse effect on capacitance characteristics can be suppressed even if etching damage is caused to the dielectric layer or the insulating layer. Hence, it is possible to suppress an increase in a leakage current from the capacitor elements, and to improve withstand voltage characteristics.

Still another aspect of the present disclosure provides a semiconductor device including: a first capacitor element that includes a first electrode, a second electrode, and a dielectric layer positioned between the first electrode and the second electrode; a second capacitor element that includes a third electrode and an insulating layer positioned between the second electrode and the third electrode; and a second contact plug. The first capacitor element includes at least one first trench portion. The first electrode, the second electrode, and the third electrode are stacked on each other in this order. At least a part of the first electrode, at least a part of the second electrode, and at least a part of the third electrode overlap each other in a plan view. The second electrode includes a third non-overlapping portion that does not overlap either of the insulating layer and the third electrode in the plan view. The second contact plug is connected to the second electrode at the third non-overlapping portion. The second contact plug penetrates the third non-overlapping portion, or the third contact plug penetrates the fourth non-overlapping portion.

Consequently, the second contact plug or the third contact plug and a different contact plug can be formed in the same step. Since the number of steps such as etching can be reduced, misalignment of masks is not likely to be caused, and a reliable semiconductor device can be achieved.

A permittivity of the dielectric layer may be higher than a permittivity of the insulating layer, for example.

Consequently, the first capacitor element can have an increased capacitance value, and the capacitance density per unit area can be further enhanced.

The semiconductor device according to the aspect of the present disclosure may include a coating insulating film that covers the second capacitor element, and a permittivity of the insulating layer may be higher than a permittivity of the coating insulating film, for example.

Consequently, the second capacitor element can have an increased capacitance value, and the capacitance density per unit area can be further enhanced.

The second capacitor element may include the second electrode, for example.

Consequently, the second electrode is shared by the two capacitor elements, and thus wires to connect the two capacitor elements can be reduced, and the occurrence of an unnecessary component in the circuit such as a parasitic capacitance can be suppressed.

The second capacitor element may further include a fourth electrode positioned between the second electrode and the insulating layer, for example.

Consequently, the four electrodes included in the two capacitor elements can be electrically separated from each other, and thus the degree of freedom in the wiring layout can be further enhanced.

The first electrode and the third electrode may be electrically connected to each other.

Consequently, the first capacitor element and the second capacitor element can be connected in parallel with each other, and thus the capacitance density per unit area can be enhanced.

No potential may be supplied to the second electrode, for example.

Consequently, the first capacitor element and the second capacitor element can be connected in series with each other, and thus a leakage current can be reduced.

The first electrode may not be electrically connected to the third electrode, for example.

Consequently, the first capacitor element and the second capacitor element can be provided with individual functions.

The second capacitor element may include at least one second trench portion, for example.

Consequently, the capacitance density per unit area can be further enhanced. The at least one first trench portion may overlap the at least one second trench portion in the plan view.

An aspect of the present disclosure provides an imaging device including the semiconductor device according to the above aspect.

Consequently, an imaging device that includes capacitor elements with a high degree of freedom in design can be achieved. For example, the capacitor elements can be provided with a desired function in a signal processing circuit that processes a charge generated by a photoelectric conversion section. For example, by using capacitor elements with a high capacitance density per unit area as a part of a charge storage region, it is possible to achieve an imaging device with an improved dynamic range, or with high pixel definition or a reduced size due to a reduction in the area of pixels. By using capacitor elements with a reduced leakage current, it is possible to achieve an imaging device that can generate high-quality images with low noise.

An embodiment will be specifically described below while referring to the drawings.

The embodiment to be described below indicates a generic or specific example. The numerical values, shapes, materials, constituent elements, arrangement position and connection mode of the constituent elements, steps, order of the steps, etc. indicated in the following embodiment are exemplary, and are not intended to limit the present disclosure. Of the constituent elements in the following embodiment, constituent elements not defined in the independent claims are described as optional constituent elements.

The drawings are schematic views, and are not necessarily exact illustrations. Thus, the drawings are not necessarily to scale, for example. In the drawings, substantially identical components are denoted by like reference numerals to omit or simplify redundant description.

Herein, the terms that indicate the relationship between elements such as "parallel" and "perpendicular", the terms that indicate the shape of elements, and the numerical ranges do not only represent the exact meanings of the expressions, but also represent substantially equivalent ranges including differences of several percent, for example.

The terms "above" and "below" as used herein do not indicate the upper direction (vertically upper) and the lower direction (vertically lower) in the absolute space recognition, and are used as terms prescribed in accordance with the relative positional relationship which is based on the stacking order of stacked components. The terms "above" and "below" are applied not only in the case where two constituent elements are disposed with a space therebetween and with another constituent element present between the two constituent elements, but also in the case where the two constituent elements are disposed in close contact with each other.

The phrase "as viewed in plan" or "in a plan view" as used herein indicates that the object is seen in a direction that is perpendicular to the principal surface of a semiconductor substrate.

When two layers are described herein as being positioned in the "same layer", it is meant that the two layers are provided in contact with the upper surface of one predetermined layer, or that the two layers are located above the upper surface of one predetermined layer at an equal distance from the one predetermined layer. At this time, in the case where the one predetermined layer is a flattened film, the two layers are at a substantially equal height with reference to the principal surface of a semiconductor substrate.

Ordinal numbers such as "first" and "second" are used herein for the purpose of avoid confusion of and differentiate constituent elements of the same kind, rather than meaning the number or order of constituent elements, unless otherwise noted.

Embodiment

[1. Circuit Configuration]

FIG. 1 illustrates an exemplary circuit configuration of an imaging device 100 according to the present embodiment. As illustrated in FIG. 1, the imaging device 100 includes a plurality of pixels 10 and a peripheral circuit. The plurality of pixels 10 are arranged two-dimensionally, for example, to form a pixel region RA. In FIG. 1, for simplicity, four of the plurality of pixels 10 are extracted to be illustrated, and the other pixels 10 are not illustrated. The peripheral circuit is disposed in a peripheral region outside the pixel region RA. Needless to say, the number and the arrangement of the pixels 10 are not specifically limited. The pixels 10 may be arranged one-dimensionally. In this case, the imaging device 100 can be used as a line sensor.

Each of the plurality of pixels 10 is connected to a power source wire 22. A predetermined power source voltage AVDD is supplied to each of the plurality of pixels 10 via the power source wire 22 during operation of the imaging device 100. A storage control line 17 is connected to each of the plurality of pixels 10. As described in detail later, each of the plurality of pixels 10 includes a photoelectric conversion section that performs a photoelectric conversion on incident light, and a signal detection circuit that detects a signal generated by the photoelectric conversion section. In a typical embodiment, the storage control line 17 applies a common predetermined voltage to the photoelectric conversion sections of the pixels 10.

In the configuration illustrated in FIG. 1, the peripheral circuit of the imaging device 100 includes a vertical scanning circuit 16, a plurality of load circuits 19, a plurality of column signal processing circuits 20, a plurality of inverting amplifiers 24, and a horizontal signal reading circuit 21. The load circuits 19, the column signal processing circuits 20, and the inverting amplifiers 24 are disposed for each column of the pixels 10 arranged two-dimensionally. The vertical scanning circuit is also referred to as a row scanning circuit. The column signal processing circuits are also referred to as row signal storage circuits. The horizontal signal reading circuit is also referred to as a column scanning circuit.

An address signal line 30 and a reset signal line 26 are connected to the vertical scanning circuit 16. The vertical scanning circuit 16 selects a row of the plurality of pixels 10 disposed in rows by applying a predetermined voltage to the address signal line 30. A signal voltage is read and a signal charge is reset for the selected pixels 10 by selecting a row of the plurality of pixels 10.

In the illustrated example, a feedback control line 28 and a sensitivity adjustment line 32 are further connected to the vertical scanning circuit 16. A feedback loop that returns an output from the pixels 10 as negative feedback is formed when the vertical scanning circuit 16 applies a predetermined voltage to the feedback control line 28. The vertical scanning circuit 16 can supply a predetermined voltage to the plurality of pixels 10 via the sensitivity adjustment line 32.

The imaging device 100 includes a vertical signal line 18 provided for each column of the plurality of pixels 10. The load circuit 19 is electrically connected to each vertical signal line 18. The plurality of pixels 10 are electrically connected to the column signal processing circuit 20 via the corresponding vertical signal line 18.

The column signal processing circuits 20 perform noise suppression signal processing represented by correlated double sampling, analog-digital conversion, etc. The horizontal signal reading circuit 21 is electrically connected to the column signal processing circuits 20 which are provided in correspondence with the rows of the plurality of pixels 10. The horizontal signal reading circuit 21 sequentially reads signals from the plurality of column signal processing circuits 20 to send such signals to a horizontal common signal line 23.

As illustrated in FIG. 1, the power source wire 22, a feedback line 25, and the vertical signal line 18 extend in the vertical direction in FIG. 1, that is, in the direction of the rows of the plurality of pixels 10. The feedback line 25 and the vertical signal line 18, which are provided for each column of the plurality of pixels 10, are connected to each of the plurality of pixels 10 arranged along the column direction. On the other hand, the storage control line 17, the reset signal line 26, the feedback control line 28, the address signal line 30, and the sensitivity adjustment line 32 extend in the direction of the rows of the plurality of pixels 10, for example. These signal lines are connected to each of the plurality of pixels 10 arranged along the row direction. The storage control line 17 and the sensitivity adjustment line 32 may extend in the direction of the columns of the plurality of pixels 10. The storage control line 17 and the sensitivity adjustment line 32 may be connected to each of the plurality of pixels 10 arranged along the column direction.

In the configuration illustrated in FIG. 1, the inverting amplifier 24 is provided in correspondence with each column of the plurality of pixels 10. A negative input terminal of the inverting amplifier 24 is connected to the corresponding vertical signal line 18. A predetermined voltage Vref is supplied to a positive input terminal of the inverting amplifier 24. The voltage Vref is a positive voltage of 1V or in the vicinity of 1V, for example. An output terminal of the inverting amplifier 24 is connected to pixels 10, to which the negative input terminal of the inverting amplifier 24 is connected, via one of a plurality of feedback lines 25 provided in correspondence with the plurality of columns of the pixels 10. The inverting amplifier 24 constitutes a part of a feedback circuit that returns an output from the pixels 10 as negative feedback. The inverting amplifier 24 may be also referred to as a feedback amplifier.

Figure 2:
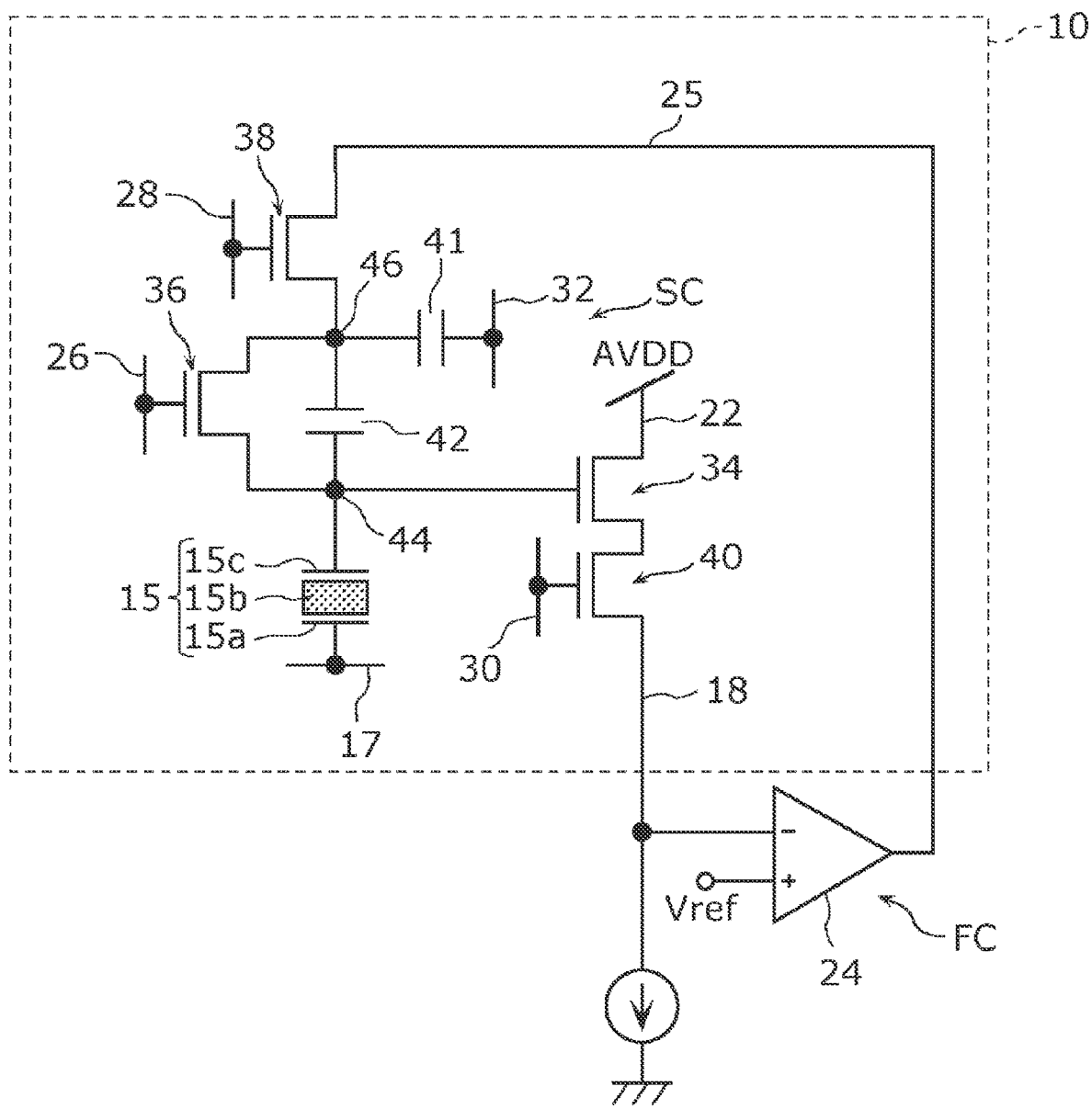
FIG. 2 illustrates an example of the circuit configuration of a pixel of the imaging device according to the embodiment.

FIG. 2 illustrates an example of the circuit configuration of a pixel 10 of the imaging device 100 according to the present embodiment. In the present embodiment, the plurality of pixels 10 of the imaging device 100 have the same configuration as each other.

As illustrated in FIG. 2, the pixel 10 includes a photoelectric conversion section 15 and a signal detection circuit SC. In the configuration illustrated in FIG. 2, the imaging device 100 includes a feedback circuit FC that returns an output from the signal detection circuit SC as negative feedback.

The photoelectric conversion section 15 includes a transparent electrode 15a, a photoelectric conversion film 15b, and a pixel electrode 15c. The transparent electrode 15a of the photoelectric conversion section 15 is connected to the storage control line 17. The pixel electrode 15c of the photoelectric conversion section 15 is connected to a charge storage node 44. By controlling the potential of the transparent electrode 15a via the storage control line 17, either a positive charge (specifically a positive hole) or a negative charge (specifically an electron) generated on the photoelectric conversion film 15b through a photoelectric conversion can be collected at the pixel electrode 15c. In the case where a positive hole is used as a signal charge, for example, the potential of the transparent electrode 15a is preferably rendered higher than that of the pixel electrode 15c. A case where a positive hole is used as a signal charge will be described below. A voltage of about 10 V, for example, is applied to the transparent electrode 15a via the storage control line 17. This allows a signal charge to be stored in the charge storage node 44. An electron may be used as a signal charge.

The signal detection circuit SC includes a signal detection transistor 34 that amplifies and outputs a signal generated by the photoelectric conversion section 15, and a first capacitor element 41. In the illustrated example, the signal detection circuit SC further includes a reset transistor 36, a feedback transistor 38, a second capacitor element 42 that has a smaller capacitance value than that of the first capacitor element 41, and an address transistor 40. In the present embodiment, in this manner, each of the plurality of pixels 10 includes one or more capacitor elements in the pixel. The kTC noise may be reduced effectively, for example, as the first capacitor element 41 has a relatively large capacitance value. An example in which N-channel metal oxide semiconductor field effect transistor (MOSFET) is used as a transistor such as the signal detection transistor 34 will be described below.

The gate of the signal detection transistor 34 is connected to the charge storage node 44. In other words, the gate of the signal detection transistor 34 is connected to the pixel electrode 15c. The drain of the signal detection transistor 34 is connected to the power source wire 22 as a source follower power source. The source of the signal detection transistor 34 is connected to the vertical signal line 18 via the address transistor 40. The signal detection transistor 34 and the load circuit 19 (not illustrated in FIG. 2; see FIG. 1) constitute a source follower circuit.

In the example illustrated in FIG. 2, the address transistor 40 is connected between the source of the signal detection transistor 34 and the vertical signal line 18. The gate of the address transistor 40 is connected to the address signal line 30. In the case where a signal charge is stored in the charge storage node 44, a voltage that matches the amount of the stored signal charge is applied to the gate of the signal detection transistor 34. The signal detection transistor 34 amplifies the voltage applied to the gate thereof. When the address transistor 40 is turned on, the voltage amplified by the signal detection transistor 34 is selectively read as a signal voltage. The address transistor 40 may be connected between the drain of the signal detection transistor 34 and the power source wire 22. That is, the drain of the signal detection transistor 34 may be connected to the power source wire 22 via the address transistor 40.

In the configuration illustrated in FIG. 2, one of a pair of electrodes of the first capacitor element 41 is connected to the sensitivity adjustment line 32. A pad portion is connected to the sensitivity adjustment line 32. The potential of the sensitivity adjustment line 32 is adjusted by a voltage applied to the pad portion. For example, during operation of the imaging device 100, the potential of the sensitivity adjustment line 32 is stationary at a constant potential such as 0 V. The sensitivity adjustment line 32 can be used to control the potential of the charge storage node 44. The other of the pair of electrodes of the first capacitor element 41 is connected to one of a pair of electrodes of the second capacitor element 42. Hereinafter, the node including the point of connection between the first capacitor element 41 and the second capacitor element 42 will occasionally be referred to as a reset drain node 46.

The other of the pair of electrodes of the second capacitor element 42 is connected to the charge storage node 44. That is, one of the pair of electrodes of the second capacitor element 42 that is not connected to the reset drain node 46 is electrically connected to the pixel electrode 15c of the photoelectric conversion section 15. In the example illustrated in FIG. 2, the reset transistor 36 is connected in parallel with the second capacitor element 42. The gate of the reset transistor 36 is connected to the reset signal line 26.

In the configuration illustrated in FIG. 2, the pixel 10 includes the feedback transistor 38. As illustrated in the drawing, one of the source and the drain of the feedback transistor 38 is connected to the reset drain node 46. The other of the source and the drain of the feedback transistor 38 is connected to the feedback line 25. The gate of the feedback transistor 38 is connected to the feedback control line 28.

[2. Device Structure of Pixel]

Next, an example of the device structure of the pixel 10 will be described while referring to FIG. 3.

Figure 3:
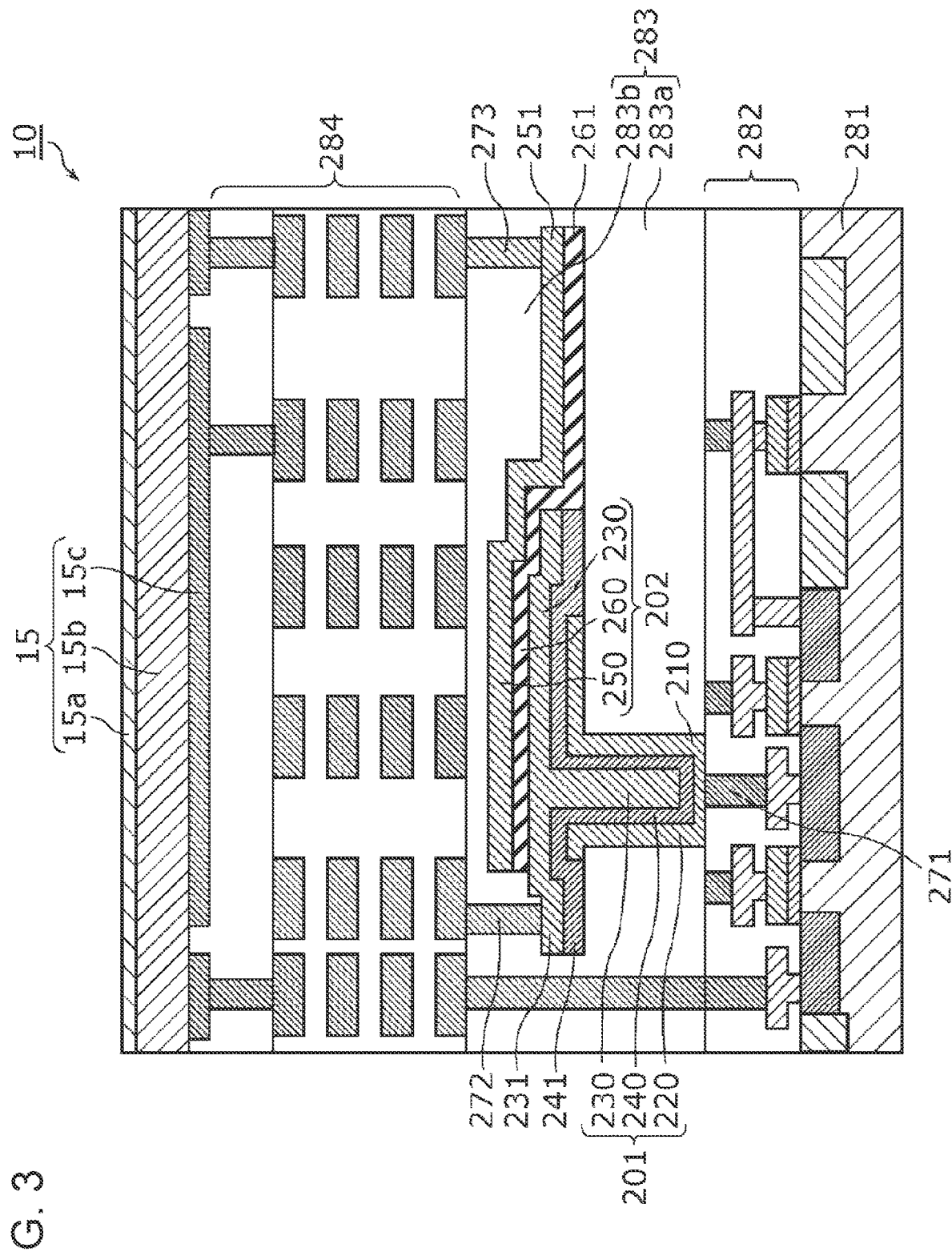
FIG. 3 is a sectional view of the pixel of the imaging device according to the embodiment.

FIG. 3 is a schematic sectional view of the pixel 10 of the imaging device 100 according to the present embodiment. In FIG. 3, an interlayer insulating layer 283 and insulating layers included in a transistor layer 282 and a wiring layer 284 are not shaded to indicate that such areas are sections, in consideration of the viewability of the drawing. The same applies to FIGS. 6A to 10 to be discussed later.

The imaging device 100 according to the present embodiment includes a plurality of pixels 10. As illustrated in FIG. 3, each of the plurality of pixels 10 includes a substrate 281, a transistor layer 282, an interlayer insulating layer 283, capacitor elements 201 and 202, a wiring layer 284, and a photoelectric conversion section 15.

The photoelectric conversion section 15 includes a transparent electrode 15a, a photoelectric conversion film 15b, and a pixel electrode 15c. The photoelectric conversion film 15b is disposed between the transparent electrode 15a and the pixel electrode 15c.

The transparent electrode 15a may be a film made of a metal oxide such as ITO (Indium Tin Oxide), IZO (Indium Zinc Oxide), InGaZnO, InO, ZnO, AZO (Aluminum-doped Zinc Oxide), or GZO (Gallium-doped Zinc Oxide), an ultra-thin metal film such as Ag, Au, or Al, a film obtained by depositing particulate or wire-like metal, etc. While the transparent electrode 15a is provided continuously over the plurality of pixels 10, the transparent electrode 15a may be provided separately for each pixel 10.

The photoelectric conversion film 15b is formed using a photoelectric conversion material that generates a charge from incident light through a photoelectric conversion. A desired organic or inorganic material can be selected as the photoelectric conversion material in order to obtain desired photoelectric conversion characteristics. For example, the imaging device 100 can be caused to function as a visible sensor when the photoelectric conversion film 15b is formed using a material that can convert light with a wavelength of 400 nm to 800 nm into a charge. Meanwhile, the imaging device 100 can be caused to function as a near-infrared sensor when the photoelectric conversion film 15b is formed using a material that can convert light with a wavelength of 800 nm to 2000 nm into a charge. While the photoelectric conversion film 15b is provided continuously over the plurality of pixels 10, the photoelectric conversion film 15b may be provided separately for each pixel 10.

The pixel electrode 15c may be a film made of a metal oxide such as TiN or TaN or a metal film made of Ag, Au, Al, Cu, W, Ti, Ta, etc. The pixel electrode 15c is provided separately for each pixel 10.

The pixel electrode 15c collects a charge generated through a photoelectric conversion performed by the photoelectric conversion film 15b. A shield electrode that shields the effect of a potential between adjacent pixel electrodes 15c may be formed around the pixel electrode 15c.

The substrate 281 is a silicon substrate, for example. The substrate 281 is not limited to a substrate, the entirety of which is a semiconductor. For example, the substrate 281 may be an insulating substrate, on the surface of which a semiconductor layer is provided. Here, the substrate 281 is a p-type silicon substrate, by way of example.

A plurality of impurity regions are formed in the substrate 281. The impurity regions are regions in which an n-type dopant is diffused, for example. Each of the plurality of impurity regions functions as a source region or a drain region of each transistor included in the signal detection circuit SC.

The transistor layer 282 is disposed on the substrate 281. The transistor layer 282 includes a gate electrode and a gate insulating film of a transistor, contact vias connected to a gate electrode, a source region, and a drain region, and an interlayer insulating film that covers the gate electrode, the gate insulating film, and the principal surface of the substrate 281.

While the gate electrode and the contact vias are made of conductive polysilicon, for example, the gate electrode and the contact vias may be made of a metal material such as Cu. The gate insulating film is formed using an insulating material such as $SiO_2$, SiON, or SiN. The interlayer insulating film is formed using an insulating material such as TEOS (tetraethoxysilane), $SiO_2$, SiON, or SiN. The interlayer insulating film is provided continuously over the plurality of pixels 10. The upper surface of the interlayer insulating film has been flattened. The upper surface is one of the principal surfaces of the interlayer insulating film on the side on which the photoelectric conversion section 15 is provided. The plurality of contact vias are provided so as to penetrate the interlayer insulating film.

The interlayer insulating layer 283 is disposed on the transistor layer 282. The interlayer insulating layer 283 has a stacked structure of a plurality of insulating layers. For example, as illustrated in FIG. 3, the interlayer insulating layer 283 includes a lower insulating layer 283a and an upper insulating layer 283b. Each of the lower insulating layer 283a and the upper insulating layer 283b includes one or more insulating layers. The lower insulating layer 283a is an example of a support insulating film that supports the capacitor elements 201 and 202. The upper insulating layer 283b is an example of a coating insulating film that covers the capacitor elements 201 and 202.

The plurality of insulating layers included in the interlayer insulating layer 283 are formed using an insulating material such as TEOS, $SiO_2$, SiON, or SiN. The capacitor elements 201 and 202 are formed inside the interlayer insulating layer 283. That is, the capacitor elements 201 and 202 are formed between the photoelectric conversion section 15 and the substrate 281. The capacitor elements 201 and 202 are formed so as to be sandwiched between the lower insulating layer 283a and the upper insulating layer 283b. The semiconductor device according to the present disclosure includes the capacitor elements 201 and 202 and the interlayer insulating layer 283, for example. A specific configuration of the capacitor elements 201 and 202 will be described later.

The wiring layer 284 includes a plurality of wires, an interlayer insulating film that covers the plurality of wires, and via conductors that connect different wires in the thickness direction. The pixel electrode 15c is provided in the uppermost layer of the wiring layer 284. The wires and the via conductors are formed using metal such as Cu or a conductive material such as conductive polysilicon. The interlayer insulating film is formed using an insulating material such as TEOS, $SiO_2$, SiON, or SiN.

The number of layers of the wire layers and the number of layers of the insulating layers disposed in the wiring layer 284 are not limited to the respective numbers of such layers illustrated in FIG. 3, and may be set as desired.

[3. Two Capacitor Elements]

Subsequently, a specific configuration and the electrical connection of the two capacitor elements 201 and 202 will be described. While the capacitor elements 201 and 202 correspond to the first capacitor element 41 and the second capacitor element 42, respectively, illustrated in FIG. 2, for example, this is not limiting.

[3-1. Configuration]

Each of the capacitor elements 201 and 202 has a "metal-insulator-metal (MIM) structure" in which a dielectric or an insulator is sandwiched between two electrodes formed from a conductive material such as metal or a metal compound. The capacitor element 201 is an example of a first capacitor element, and includes a first electrode 220, a second electrode 230, and a dielectric layer 240. The capacitor element 202 is an example of a second capacitor element, and includes the second electrode 230, a third electrode 250, and an insulating layer 260.

In the present embodiment, the first electrode 220, the second electrode 230, and the third electrode 250 are stacked in this order, and at least partially overlap each other as viewed in plan. Specifically, the first electrode 220, the dielectric layer 240, the second electrode 230, the insulating layer 260, and the third electrode 250 are stacked in this order, and at least partially overlap each other as viewed in plan. That is, the capacitor element 201 and the capacitor element 202 overlap each other as viewed in plan.

The capacitor element 201 is a trench capacitor that includes at least one trench portion 210. The capacitor element 202 is a planar capacitor that does not include a trench portion.

The trench portion 210 is a part of the capacitor element 201, and is a portion formed in a groove or a recessed portion (i.e. a trench) formed in the interlayer insulating layer 283. The term "trench" refers to a site formed by removing a part of the lower insulating layer 283a through etching, and may be of any shape. The trench may be in the shape of a circular column, a circular cone, a cube, a rectangular parallelepiped, etc., for example.

At least one trench is formed by forming the transistor layer 282 on the substrate 281, forming the lower insulating layer 283a on the transistor layer 282, and thereafter etching the lower insulating layer 283a. The first electrode 220, the dielectric layer 240, and the second electrode 230 are sequentially formed along the inner surface of the trench. The first electrode 220 and the dielectric layer 240 are formed to have a substantially uniform film thickness inside the trench. The second electrode 230 is formed so as to fill the trench. That is, the capacitor element 201 extends three-dimensionally, not only in a direction that is parallel to the principal surface of the substrate 281 but also in the direction of the thickness of the substrate 281. Consequently, the capacitor element 201 can have an increased electrode area compared to planar capacitors that do not include a trench portion, and thus can have an enhanced capacitance density per unit area.

In the present embodiment, a contact via 271 formed in the transistor layer 282 is connected to the first electrode 220 of the capacitor element 201 in the trench portion 210. The contact via 271 is an example of a first contact plug. A plurality of contact vias 271 may be formed in the trench portion 210, and the trench portion 210 may be connected to a plurality of transistors. The upper part of the contact via 271 is exposed to the bottom of the trench. This allows contact with the first electrode 220 of the capacitor element 201.

The first electrode 220 is formed so as to cover a part of the upper surface of the lower insulating layer 283a and the upper surface of the contact via 271. The first electrode 220 is formed by forming a film of a conductive material using a method with high coating performance such as an atomic layer deposition (ALD) process or a chemical vapor deposition (CVD) process, in order to coat the inner surface of the trench with a substantially uniform film thickness. The conductive material may be a metal oxide such as TiN or TaN, a metal film made of Ag, Au, Al, Cu, W, Ti, Ta, etc., or a transparent electrode made of ITO, IZO, InGaZnO, InO, ZnO, AZO, GZO, etc.

The first electrode 220 is patterned into a predetermined shape. A part of the first electrode 220 is provided outside the trench. That is, the first electrode 220 includes a portion included in the trench portion 210 and a flat portion on the upper surface of the lower insulating layer 283a. The flat portion is provided in parallel with the substrate 281, for example.

The dielectric layer 240 is positioned between the first electrode 220 and the second electrode 230. The dielectric layer 240 is in contact with the upper surface of the first electrode 220 and the lower surface of the second electrode 230, for example. The dielectric layer 240 is patterned into a predetermined shape so as to cover the first electrode 220. For example, the dielectric layer 240 is formed by forming a film of a dielectric material using a method such as the ALD process or the CVD process, in order to coat the upper surface of the first electrode 220 with a film with a substantially uniform thickness along the shape of the inner surface of the trench.

In the present embodiment, the dielectric layer 240 covers the entire upper surface of the first electrode 220. That is, the first electrode 220 is completely covered by the dielectric layer 240, and no portion of the first electrode 220 protrudes from the dielectric layer 240 as viewed in plan. The dielectric layer 240 includes a non-overlapping portion 241 that does not overlap the first electrode 220 as viewed in plan. The non-overlapping portion 241 is an example of a first non-overlapping portion, and is positioned on the upper surface of the lower insulating layer 283a.

In the present embodiment, the permittivity of the dielectric layer 240 is higher than the permittivity of the insulating layer 260 of the capacitor element 202, for example. A so-called high-k material with a higher permittivity than $SiO_2$ can be used as a dielectric material that constitutes the dielectric layer 240, for example. A dielectric material such as SiN, SiON, AlO, $Ta_2O_5$, HfO, ZrO, or TiO can be used for the dielectric layer 240. The permittivity of the dielectric layer 240 may be equal to the permittivity of the insulating layer 260. That is, TEOS or $SiO_2$ may be used for the dielectric layer 240.

The second electrode 230 covers the upper surface of the dielectric layer 240. The second electrode 230 is patterned into a predetermined shape by removing a part of the second electrode 230 through etching so as to be larger than the first electrode 220, together with the dielectric layer 240. The patterning of the second electrode 230 and the dielectric layer 240 is performing using the same mask, for example. Consequently, the shape and the size of the second electrode 230 substantially coincide with the shape and the size of the dielectric layer 240 as viewed in plan. The second electrode 230 may be smaller than the dielectric layer 240. Alternatively, the second electrode 230 may be larger than the dielectric layer 240, and may completely cover the dielectric layer 240.

The second electrode 230 includes a non-overlapping portion 231 that does not overlap the first electrode 220 as viewed in plan. The non-overlapping portion 231 is an example of a third non-overlapping portion, and does not overlap either of the insulating layer 260 and the third electrode 250 as viewed in plan. The non-overlapping portion 231 overlaps the non-overlapping portion 241 of the dielectric layer 240 as viewed in plan.

As illustrated in FIG. 3, the interlayer insulating layer 283 is provided with a contact via 272 connected to the second electrode 230 at the non-overlapping portion 231. The contact via 272 is an example of a second contact plug. The contact via 272 penetrates the upper insulating layer 283b.

The second electrode 230 can be formed by the same film formation method as for the first electrode 220 using the same material for the first electrode 220. The second electrode 230 is formed so as to block an opening portion of the trench, that is, so as to fill the inside of the trench. Consequently, it is possible to reduce a gap of the insulating layer 260 formed on the second electrode 230. To that end, the second electrode 230 has a stacked structure of a first conductive film and a second conductive film, for example. Specifically, a first conductive film with a film thickness that is about enough to block the opening portion of the trench is formed by a film formation method with high coating performance such as the ALD process or the CVD process, and thereafter a second conductive film is formed by a film formation method with low coating performance such as sputtering. Consequently, the second electrode 230 with a stacked structure is formed. The second electrode 230 may have a single-layer structure. The second electrode 230 may be formed using a conductive material that is different from that of the first electrode 220.

The insulating layer 260 is positioned between the second electrode 230 and the third electrode 250. The insulating layer 260 is in contact with the upper surface of the second electrode 230 and the lower surface of the third electrode 250, for example. The insulating layer 260 is patterned into a predetermined shape so as to cover the second electrode 230. In the present embodiment, the insulating layer 260 is formed in a pattern that is at least wider than a portion in which the first electrode 220, the dielectric layer 240, and the second electrode 230 overlap each other as viewed in plan, in order not to damage the capacitor element 201 which is composed of the first electrode 220, the dielectric layer 240, and the second electrode 230. For example, the insulating layer 260 is provided so as to overlap at least the trench portion 210 as viewed in plan. The insulating layer 260 includes a non-overlapping portion 261 that does not overlap the second electrode 230 as viewed in plan. The non-overlapping portion 261 is an example of a second non-overlapping portion, and is positioned on the upper surface of the lower insulating layer 283a. That is, the non-overlapping portion 261 of the insulating layer 260 is positioned at the same height as the non-overlapping portion 241 of the dielectric layer 240 in the thickness direction.

In the present embodiment, the permittivity of the insulating layer 260 is equal to or more than the permittivity of the upper insulating layer 283b. Specifically, the insulating layer 260 is formed using a dielectric material with a high permittivity such as SiN, SiON, AlO, $Ta_2O_5$, HfO, ZrO, or TiO. Alternatively, the insulating layer 260 may be formed using an insulating material with a low permittivity such as TEOS or $SiO_2$. That is, the insulating layer 260 may be formed using the same material as the dielectric layer 240, or may be formed using the same material as the upper insulating layer 283b. The insulating layer 260 can be formed by sputtering, the ALD process, the CVD process, etc. using a dielectric material or an insulating material.

The third electrode 250 covers the upper surface of the insulating layer 260. The third electrode 250 is patterned into a predetermined shape by removing a part of the third electrode 250 through etching so as to be larger than the second electrode 230, together with the insulating layer 260. The patterning of the third electrode 250 and the insulating layer 260 is performing using the same mask, for example. Consequently, the shape and the size of the third electrode 250 substantially coincide with the shape and the size of the insulating layer 260 as viewed in plan. The third electrode 250 may be smaller than the insulating layer 260. Alternatively, the third electrode 250 may be larger than the insulating layer 260, and may completely cover the insulating layer 260.

If the third electrode 250 contacts the contact via 272 for the second electrode 230, the second electrode 230 and the third electrode 250 are electrically connected to each other. Therefore, the third electrode 250 does not cover the second electrode 230 in the vicinity of the contact via 272 for the second electrode 230. That is, the third electrode 250 is wider than the first electrode 220 and narrower than the second electrode 230 as viewed in plan in the vicinity of the contact via 272.

A metal oxide such as TiN or TaN, a metal film made of Ag, Au, Al, Cu, W, Ti, Ta, etc., or a transparent electrode made of ITO, IZO, InGaZnO, InO, ZnO, AZO, GZO, etc. can be used for the third electrode 250, as for the first electrode 220 and the second electrode 230 A film formation method such as the ALD process, the CVD process, or sputtering can be used.

The third electrode 250 includes a non-overlapping portion 251 that does not overlap any of the first electrode 220, the dielectric layer 240, and the second electrode 230 as viewed in plan. The non-overlapping portion 251 is an example of a fourth non-overlapping portion. The non-overlapping portion 251 overlaps the non-overlapping portion 261 of the insulating layer 260 as viewed in plan. The non-overlapping portion 251 is positioned at the same height as the non-overlapping portion 231 of the second electrode 230 in the thickness direction.

As illustrated in FIG. 3, the interlayer insulating layer 283 is provided with a contact via 273 connected to the third electrode 250 at the non-overlapping portion 251. The contact via 273 is an example of a third contact plug. The contact via 273 penetrates the upper insulating layer 283b.

With the configuration described above, the capacitor element 201 includes the trench portion 210, and thus the capacitance density per unit area can be enhanced. The capacitor element 202 is stacked on the capacitor element 201. Thus, a desired function that matches the relationship of connection between the capacitor element 201 and the capacitor element 202 can be exhibited while suppressing an increase in the area occupied by the capacitor elements 201 and 202 as viewed in plan. That is, the characteristics exhibited by the two capacitor elements 201 and 202 can be selected in accordance with the electrical connection to the electrodes.

[3-2. Electrical Connection]

Figure 4A:
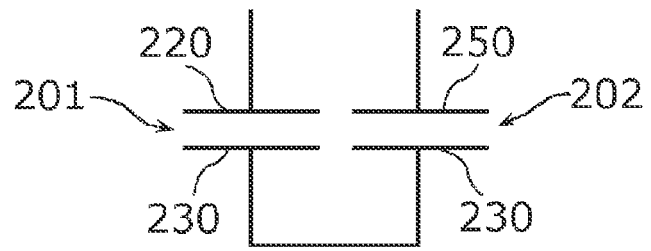
FIG. 4A illustrates a first example of the electrical connection between two capacitor elements of the imaging device according to the embodiment.
Figure 4B:
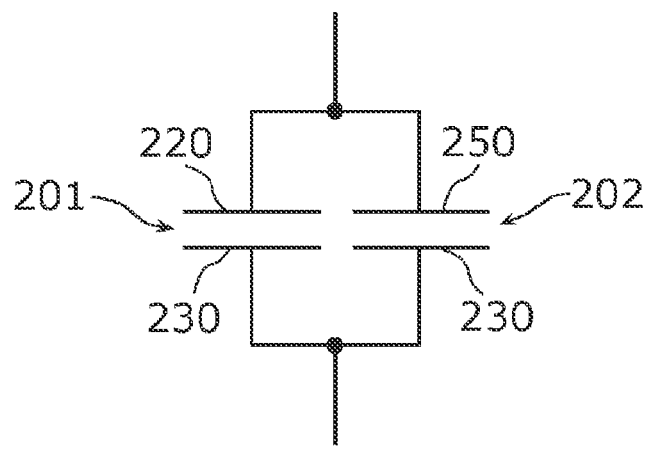
FIG. 4B illustrates a second example of the electrical connection between two capacitor elements of the imaging device according to the embodiment.
Figure 5:
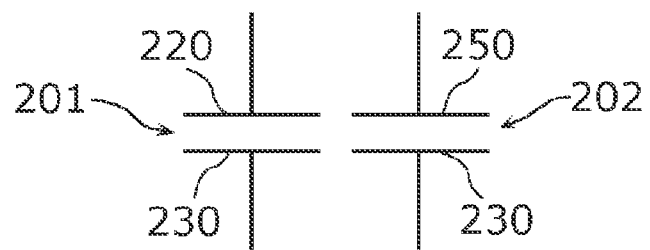
FIG. 5 illustrates a third example of the electrical connection between two capacitor elements of the imaging device according to the embodiment.

Subsequently, the electrical connection between the two capacitor elements 201 and 202 will be described with reference to Table 1 and FIGS. 4A, 4B, and 5.

Table 1 is a table that indicates an example of voltages supplied to the two capacitor elements 201 and 202 of the imaging device 100 according to the present embodiment. FIGS. 4A, 4B, and 5 illustrate first to third examples, respectively, of the electrical connection between the two capacitor elements 201 and 202 of the imaging device 100 according to the present embodiment.

TABLE 1

| Electrical connection between two capacitor elements | First electrode | Second electrode | Third electrode |
| --- | --- | --- | --- |
| Series connection | 0 V | Float | 3 V |
| Parallel connection | 3 V | 0 V | 3 V |
| No connection | 3 V | 0 V | 2 V |

For example, a voltage of 0 V is applied to the first electrode 220, a voltage of 3 V is applied to the third electrode 250, and the second electrode 230 is brought to a Float state in which no potential is supplied thereto, as indicated in Table 1. This allows the capacitor element 201 and the capacitor element 202 to be connected in series with each other as illustrated in FIG. 4A. Consequently, a semiconductor device that includes the capacitor elements 201 and 202 connected in series with each other can be used as a capacitor with good leakage current characteristics.

A voltage of 3 V is applied to the first electrode 220, a voltage of 0 V is applied to the second electrode 230, and a voltage of 3 V is applied to the third electrode 250, as indicated in Table 1. That is, the first electrode 220 and the third electrode 250 are supplied with the same potential, and electrically connected to each other. This allows the capacitor element 201 and the capacitor element 202 to be connected in parallel with each other as illustrated in FIG. 4B. Consequently, a semiconductor device that includes the capacitor elements 201 and 202 connected in parallel with each other can be used as a capacitor with a high capacitance density per unit area.

A voltage of 3 V is applied to the first electrode 220, a voltage of 0 V is applied to the second electrode 230, and a voltage of 2 V is applied to the third electrode 250, as indicated in Table 1. That is, the first electrode 220 and the third electrode 250 are not electrically connected to each other. This allows the capacitor element 201 and the capacitor element 202 to be used independently of each other as individual capacitors as illustrated in FIG. 5. In the present embodiment, the second electrode 230 is common to the two capacitor elements 201 and 202, and therefore the circuit illustrated in FIG. 5 is substantially equivalent to the circuit illustrated in FIG. 4A. Also in this case, the capacitor elements can be provided with individual functions as with the first capacitor element 41 and the second capacitor element 42 illustrated in FIG. 2.

The voltages indicated in Table 1 are exemplary, and the supplied potentials are not limited to 3 V, 2 V, and 0 V. The potentials applied to the first electrode 220 and the third electrode 250 when the capacitor element 201 and the capacitor element 202 are used as individual capacitors may be different potentials, or may be the same potential.

[3-3. Contact Via]

Subsequently, examples of the electrical connection of the capacitor elements 201 and 202 will be described with reference to FIGS. 6A and 6B.

Figure 6A:
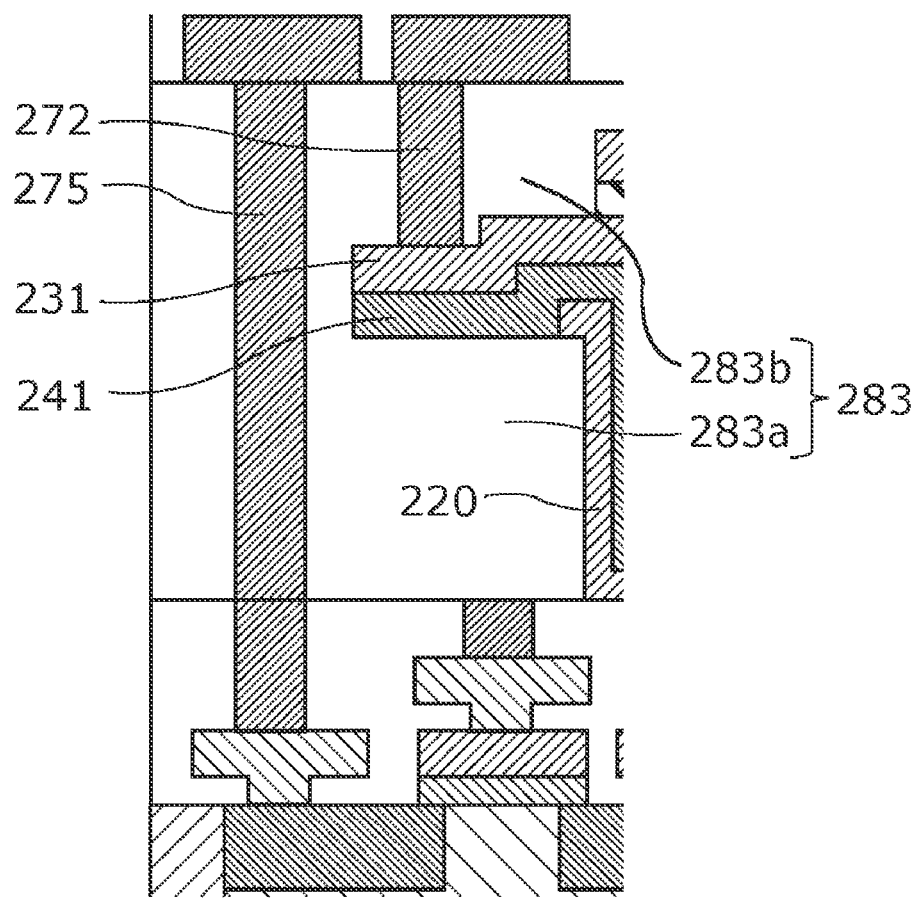
FIG. 6A is a sectional view illustrating a first example of the connection of contact vias to two capacitor elements of the imaging device according to the embodiment.
Figure 6B:
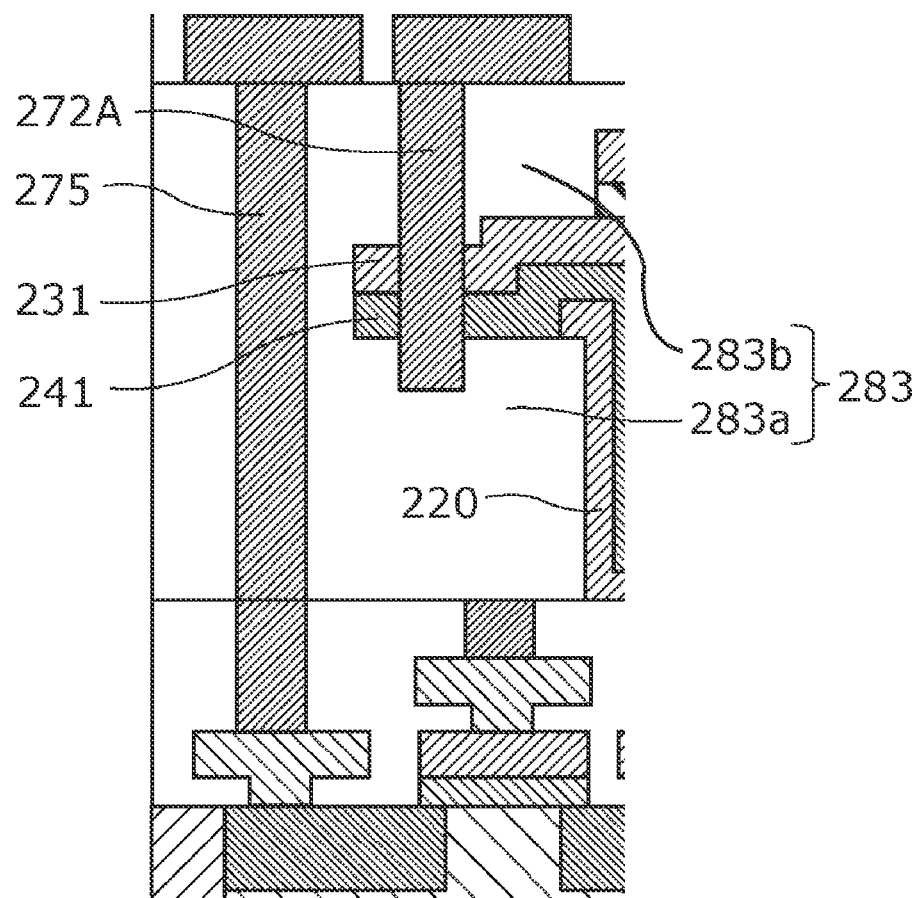
FIG. 6B is a sectional view illustrating a second example of the connection of contact vias to two capacitor elements of the imaging device according to the embodiment.

FIGS. 6A and 6B are sectional views illustrating a first example and a second example, respectively, of the connection of a contact via to the two capacitor elements 201 and 202 of the imaging device 100 according to the present embodiment. While the contact via for the non-overlapping portion 231 of the second electrode 230 is illustrated in FIGS. 6A and 6B, the same applies to the contact via for the non-overlapping portion 251 of the third electrode 250.

As illustrated in FIG. 6A, a part of the upper insulating layer 283b that covers the capacitor elements 201 and 202 is removed through etching, and a film of a metal material is formed to form a contact via 272. At this time, the contact via 272 is allowed to contact the second electrode 230 over a large surface area on the bottom surface of the contact via 272, without penetrating the second electrode 230, by using an electrode material with a lower etching rate than the etching rate of the upper insulating layer 283b, or by selecting an etching gas with a high etching selectivity. Consequently, poor contact with the electrode can be reduced.

While the contact via 272 contacts the second electrode 230 on only the upper surface thereof in FIG. 6A, a part of the contact via 272 may be embedded in the second electrode 230. This allows the contact via 272 to contact the second electrode 230 on not only the bottom surface but also a part of the side surface thereof, and thus poor contact can be further reduced.

Alternatively, as illustrated in FIG. 6B, a contact via 272A for the second electrode 230 may be formed at the same time as a contact via 275 that reaches the transistor layer 282 is formed. The interlayer insulating layer 283 and the second electrode 230 are constituted from different materials, and therefore etched at different etching rates. Specifically, the etching rate for the interlayer insulating layer 283 is higher than the etching rate for the second electrode 230. Therefore, in the case where the interlayer insulating layer 283 is etched until the transistor layer 282 is reached in a portion in which the second electrode 230 is not present, the transistor layer 282 is not reached in a portion in which the second electrode 230 is present. Consequently, a contact via 272A that penetrates the non-overlapping portion 231 of the second electrode 230 is formed as illustrated in FIG. 6B. A contact via that penetrates the non-overlapping portion 251 of the third electrode 250 is formed by performing the process also for the third electrode 250 at the same time.

Consequently, a plurality of contact vias can be formed at the same time, and thus the number of etching steps can be reduced. Misalignment of masks is not likely to be caused, and a reliable imaging device 100 can be achieved.

The contact via for the second electrode 230 and the contact via for the third electrode 250 may not be formed at the same time. For example, one of the contact vias may penetrate a non-overlapping portion of a corresponding electrode, and the other contact via may not penetrate a non-overlapping portion of a corresponding electrode.

[4. Modifications]

Subsequently, modifications of the imaging device according to the embodiment will be described. In the modifications described below, the sectional structure of pixels is different from that according to the embodiment, and the circuit configuration etc. is the same as that according to the embodiment. In the following, differences from the embodiment will be mainly described, and the description of common features will be omitted or simplified.

[4-1. First Modification]

Figure 7:
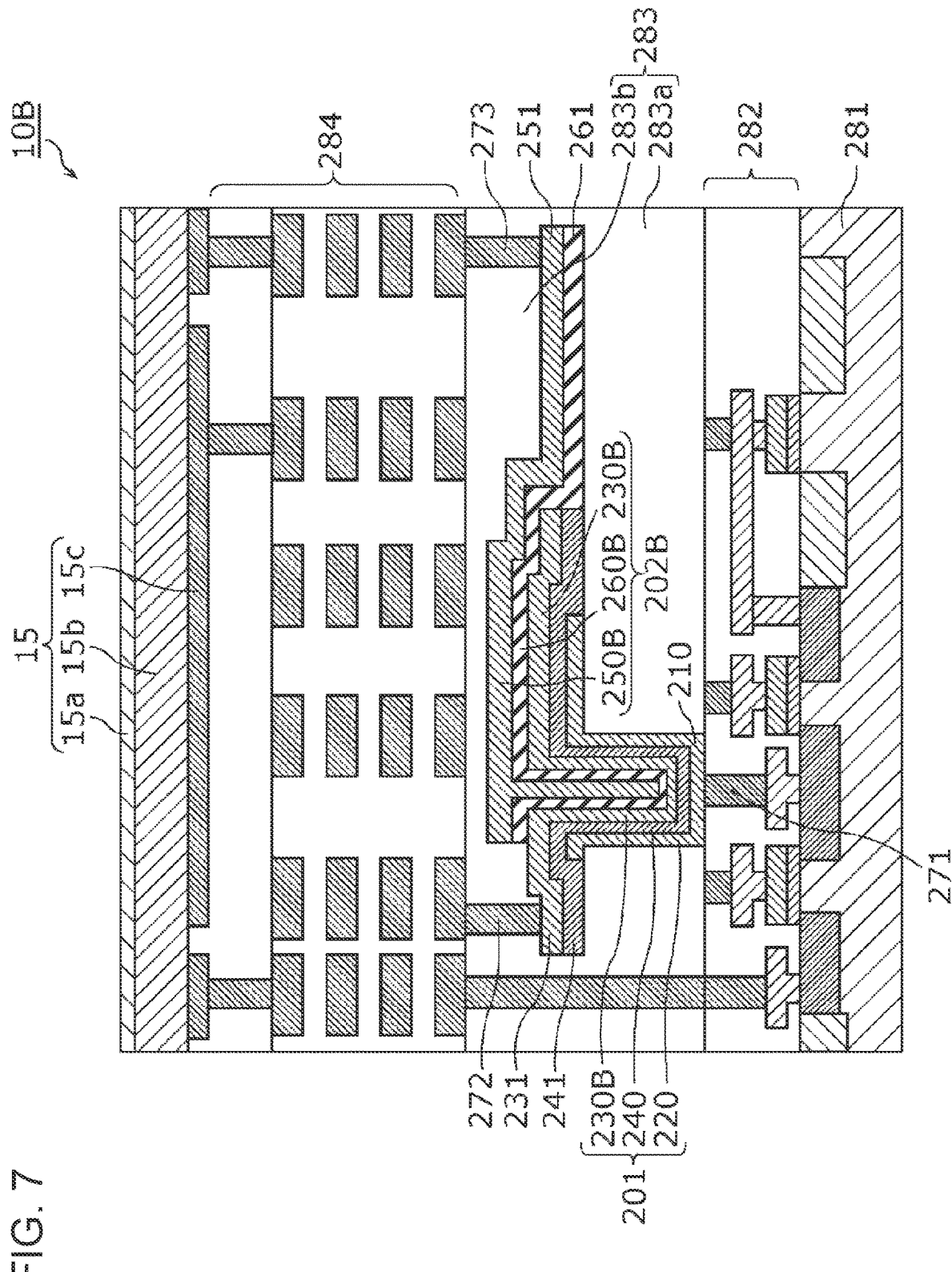
FIG. 7 is a sectional view of a pixel of an imaging device according to a first modification of the embodiment.

While the capacitor element 202 is a planar capacitor in the embodiment, for example, the capacitor element may be a trench capacitor. FIG. 7 is a sectional view of a pixel 10B of an imaging device according to a first modification. As illustrated in FIG. 7, a capacitor element 202B is a trench capacitor. The capacitor element 202B includes a second electrode 230B, a third electrode 250B, and an insulating layer 260B.

The second electrode 230B and the insulating layer 260B are formed to have a substantially uniform film thickness inside the trench. The third electrode 250B is formed so as to fill the trench. The second electrode 230B, the insulating layer 260B, and the third electrode 250B are formed using the ALD process or the CVD process with high coating performance. Consequently, the capacitor element 202B also includes a trench portion, and can have an enhanced capacitance density per unit area.

In the present modification, the trench portion of the capacitor element 202B is positioned to overlap the trench portion of the capacitor element 201 as viewed in plan. That is, the respective trench portions of the capacitor elements 201 and 202B are formed in the same trench formed in the lower insulating layer 283a. However, this is not limiting. The trench portion of the capacitor element 202B may be positioned not to overlap the trench portion of the capacitor element 201 as viewed in plan.

[4-2. Second Modification]

Figure 8:
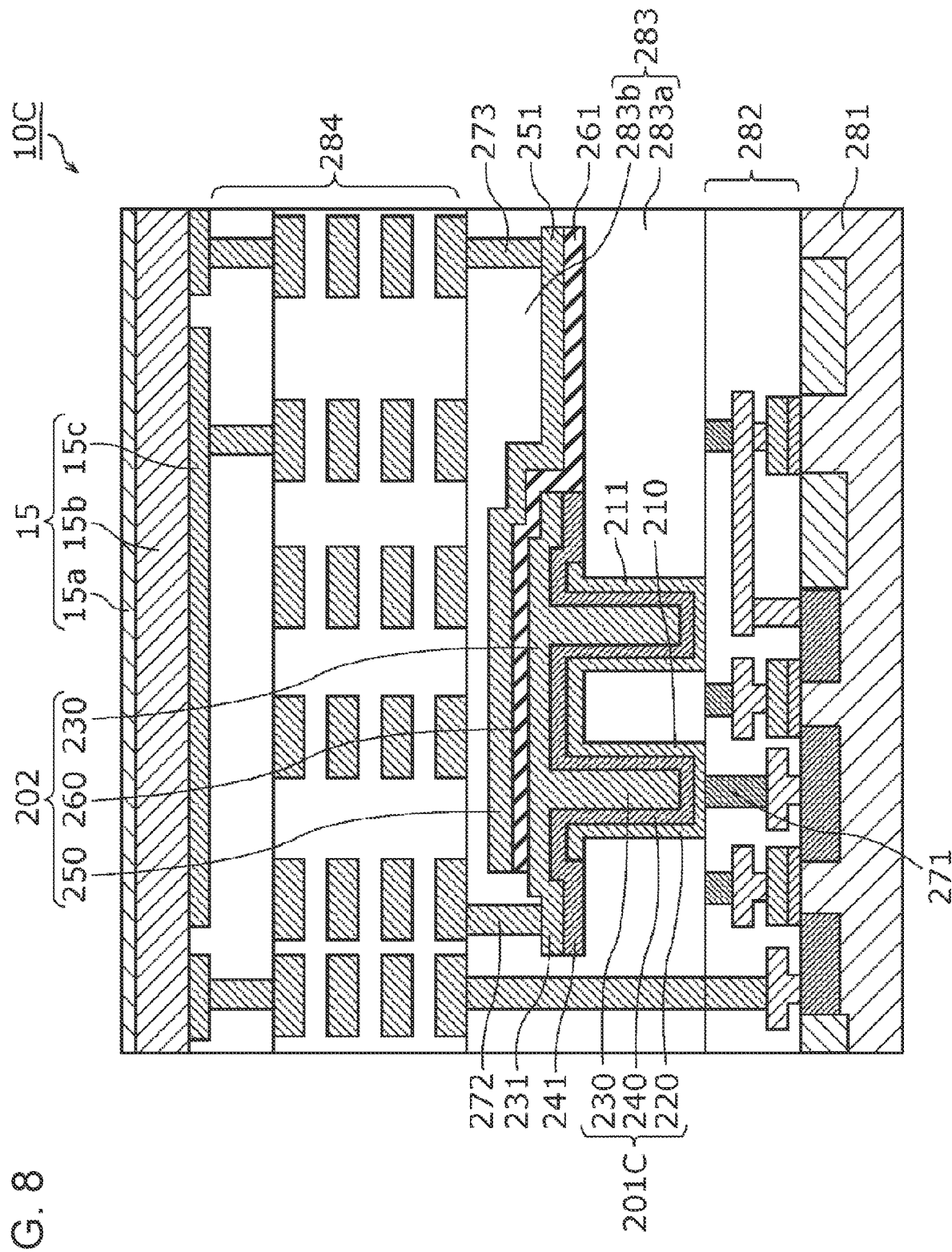
FIG. 8 is a sectional view of a pixel of an imaging device according to a second modification of the embodiment.

While the capacitor element 201 includes one trench portion 210 in the embodiment, the capacitor element 201 may include two or more trench portions. FIG. 8 is a sectional view of a pixel 10C of an imaging device according to a second modification. As illustrated in FIG. 8, a capacitor element 201C includes two trench portions 210 and 211.

The trench portion 211 can be formed to be similar to the trench portion 210. The shape, size, and number of the trench portion 211 are not specifically limited. As in the first modification, the capacitor element 202 may also include a plurality of trench portions.

[4-3. Third Modification]

Figure 9:
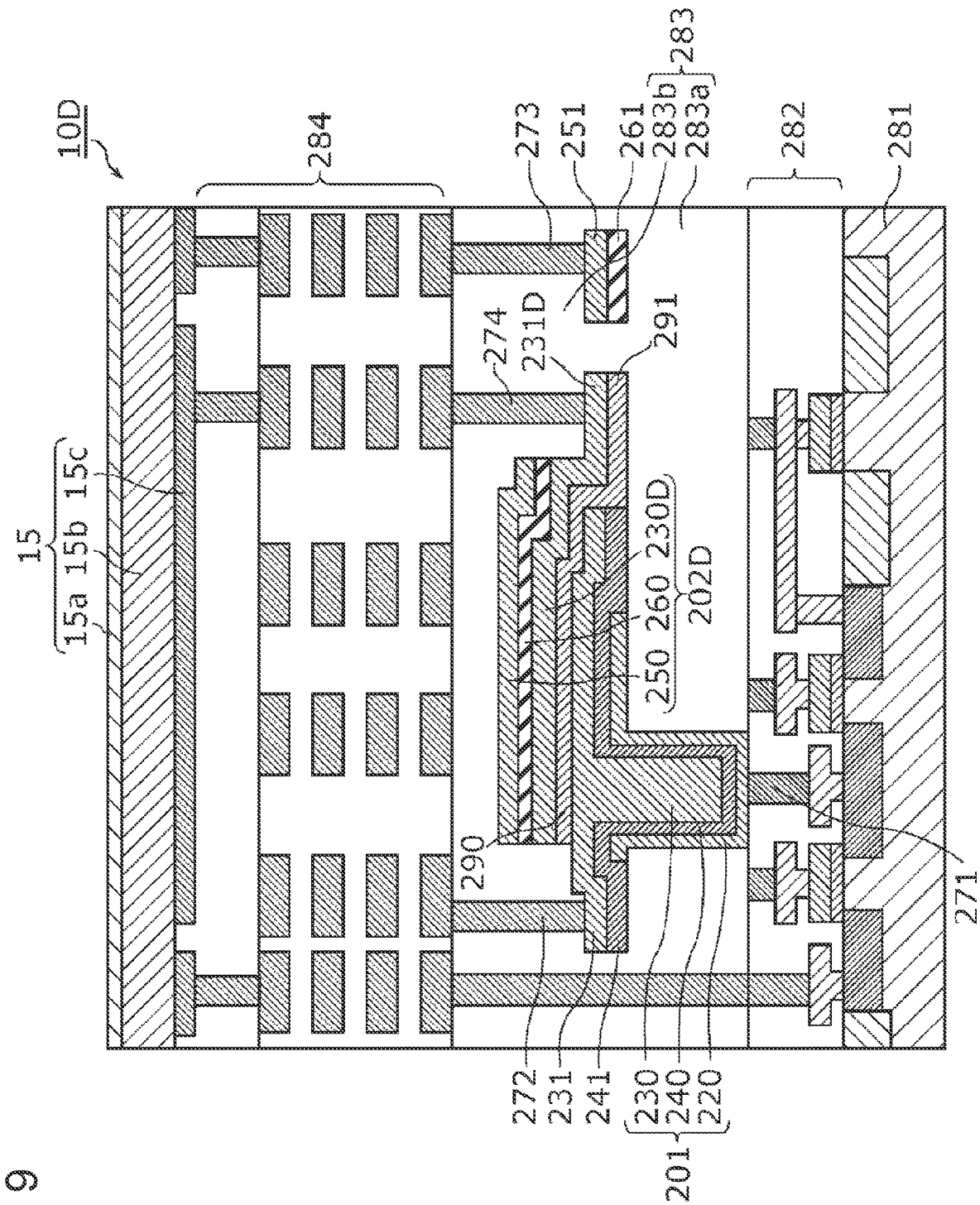
FIG. 9 is a sectional view of a pixel of an imaging device according to a third modification of the embodiment.

While the two capacitor elements 201 and 202 share the second electrode 230 in the embodiment, the second electrode 230 may not be shared. FIG. 9 is a sectional view of a pixel 10D of an imaging device according to a third modification. As illustrated in FIG. 9, the imaging device includes an insulating layer 290 positioned between the capacitor element 201 and a capacitor element 202D. The capacitor element 202D includes a fourth electrode 230D, the third electrode 250, and the insulating layer 260.

The insulating layer 290 is positioned between the second electrode 230 and the fourth electrode 230D. The insulating layer 290 is in contact with the upper surface of the second electrode 230 and the lower surface of the fourth electrode 230D, for example. The insulating layer 290 is patterned into a predetermined shape so as to cover the second electrode 230. In the present embodiment, the insulating layer 290 is formed in a pattern that is at least wider than a portion in which the first electrode 220, the dielectric layer 240, and the second electrode 230 overlap each other as viewed in plan, in order not to damage the capacitor element 201 which is composed of the first electrode 220, the dielectric layer 240, and the second electrode 230. For example, the insulating layer 290 is provided so as to overlap at least the trench portion 210 as viewed in plan. The insulating layer 290 includes a non-overlapping portion 291 that does not overlap the second electrode 230 as viewed in plan. The non-overlapping portion 291 is positioned on the upper surface of the lower insulating layer 283a. That is, the non-overlapping portion 291 of the insulating layer 290 is positioned at the same height as the non-overlapping portion 241 of the dielectric layer 240 and the non-overlapping portion 261 of the insulating layer 260 in the thickness direction.

The fourth electrode 230D covers the upper surface of the insulating layer 290. The fourth electrode 230D is patterned into a predetermined shape by removing a part of the fourth electrode 230D through etching so as to be larger than the second electrode 230, together with the insulating layer 290. The patterning of the fourth electrode 230D and the insulating layer 290 is performing using the same mask, for example. Consequently, the shape and the size of the fourth electrode 230D substantially coincide with the shape and the size of the insulating layer 290 as viewed in plan. The fourth electrode 230D may be smaller than the insulating layer 290. Alternatively, the fourth electrode 230D may be larger than the insulating layer 290, and may completely cover the insulating layer 290.

If the fourth electrode 230D contacts the contact via 272 for the second electrode 230, the second electrode 230 and the fourth electrode 230D are electrically connected to each other. Therefore, the fourth electrode 230D is patterned so as not to cover a part of the second electrode 230.

The fourth electrode 230D is formed using the same material as the second electrode 230. The fourth electrode 230D can be formed using a film formation method such as the ALD process, the CVD process, or sputtering.

The fourth electrode 230D includes a non-overlapping portion 231D that does not overlap any of the first electrode 220, the dielectric layer 240, and the second electrode 230 as viewed in plan. The non-overlapping portion 231D of the fourth electrode 230D is positioned at the same height as the non-overlapping portion 251 of the third electrode 250 and the non-overlapping portion 231 of the second electrode 230 in the thickness direction.

As illustrated in FIG. 9, the interlayer insulating layer 283 is provided with a contact via 274 connected to the fourth electrode 230D at the non-overlapping portion 231D. The contact via 274 penetrates the upper insulating layer 283*b*. Consequently, different potentials can be independently applied to the second electrode 230 and the fourth electrode 230D. Hence, the two capacitor elements 201 and 202D are allowed to easily function as individual elements.

In the section illustrated in FIG. 9, the non-overlapping portion 251 of the third electrode 250 is illustrated as being separate from a portion that constitutes the capacitor element 202D. In reality, however, the non-overlapping portion 251 is connected to the portion that constitutes the capacitor element 202D in an unillustrated portion.

In the present modification, in the case where the capacitor element 201 and the capacitor element 202D are connected in series with each other, the second electrode 230 and the fourth electrode 230D are electrically connected to each other, and the first electrode 220 and the third electrode 250 are not electrically connected to each other, for example. Alternatively, in the case where the capacitor element 201 and the capacitor element 202D are connected in series with each other, the first electrode 220 and the third electrode 250 may be electrically connected to each other, and the second electrode 230 and the fourth electrode 230D may not be electrically connected to each other, for example.

In the case where the capacitor element 201 and the capacitor element 202D are connected in parallel with each other, meanwhile, the second electrode 230 and the fourth electrode 230D are electrically connected to each other, and the first electrode 220 and the third electrode 250 are electrically connected to each other, for example. Alternatively, in the case where the capacitor element 201 and the capacitor element 202D are connected in parallel with each other, the second electrode 230 and the third electrode 250 may be electrically connected to each other, and the first electrode 220 and the fourth electrode 230D may be electrically connected to each other, for example.

In the case where the capacitor element 201 and the capacitor element 202D are caused to function as individual elements, the first electrode 220, the second electrode 230, the third electrode 250, and the fourth electrode 230D are not electrically connected to each other, for example. The second electrode 230 and the third electrode 250 may be electrically connected to each other, and the second electrode 230 and the fourth electrode 230D may be electrically connected to each other, depending on the usage.

[4-4. Fourth Modification]

While the photoelectric conversion section 15 is provided above the substrate 281 in the embodiment, the photoelectric conversion section 15 may be provided in the substrate 281. That is, a photoelectric conversion section 15E of the imaging device 100 may be a back-illuminated complementary metal oxide semiconductor (CMOS) image sensor formed in the substrate 281.

Figure 10:
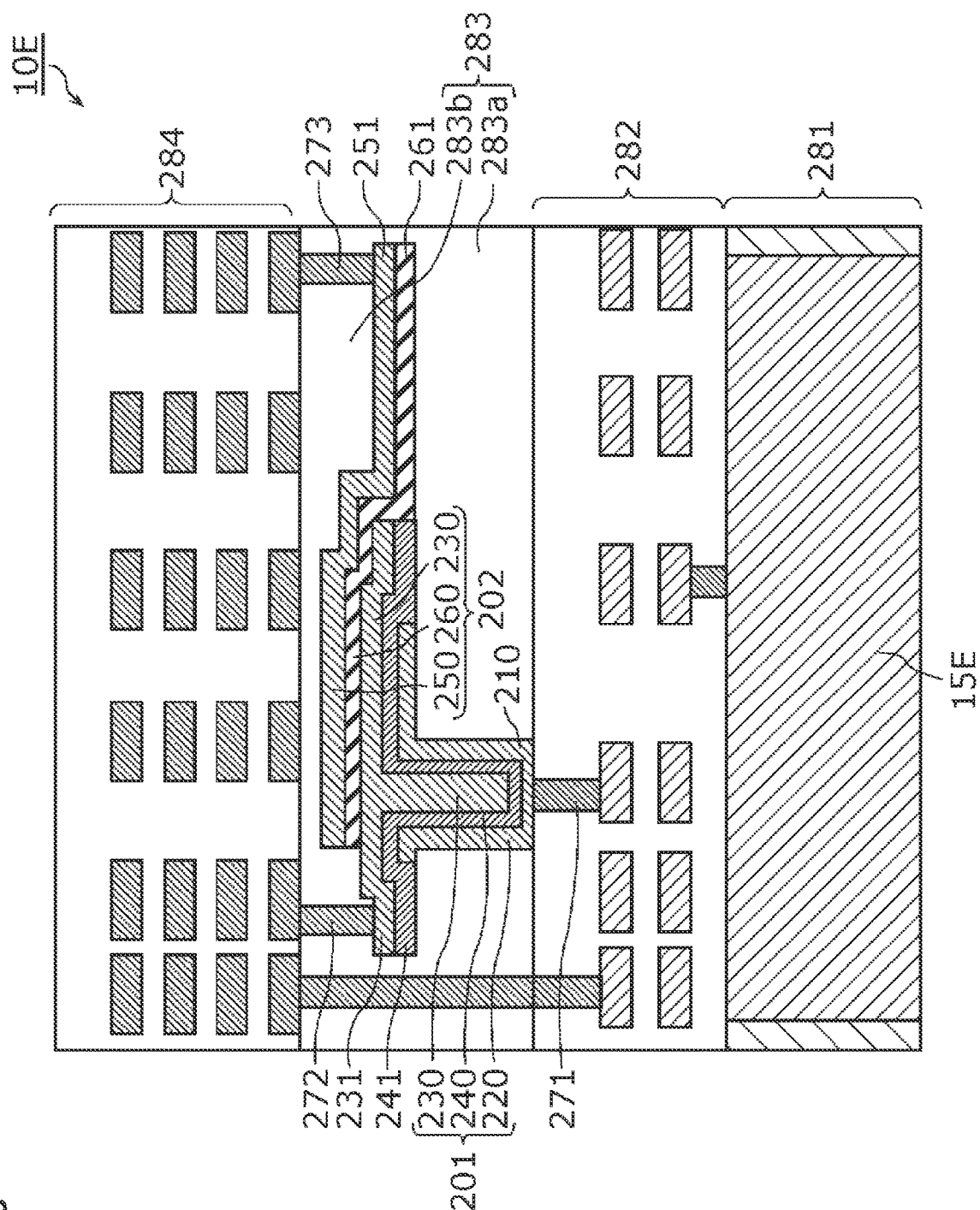
FIG. 10 is a sectional view of a pixel of an imaging device according to a fourth modification of the embodiment.

FIG. 10 is a sectional view of a pixel 10E of an imaging device according to a fourth modification. As illustrated in FIG. 10, the photoelectric conversion section 15E is provided in the substrate 281. The photoelectric conversion section 15E is a photodiode, for example. The photodiode is a pn diode that includes a pn junction, for example, and is formed using an impurity region etc. formed in the substrate 281. In the present modification, light is incident from the back surface of the substrate 281, that is, from a surface of the substrate 281 that is opposite to the surface on which the capacitor elements 201 and 202 are formed, and a photoelectric conversion is performed by the photoelectric conversion section 15E.

In the present modification, the structure of the capacitor elements indicated in the first to third modifications may be applied in place of the capacitor elements 201 and 202.

OTHER EMBODIMENTS

While the semiconductor device and the imaging device according to one or a plurality of aspects have been described above on the basis of the embodiment, the present disclosure is not limited to such an embodiment. Aspects obtained by applying various modifications conceived of by a person skilled in the art to the present embodiment and aspects constructed by combining constituent elements according to different embodiments also fall within the scope of the present disclosure unless such aspects depart from the scope and spirit of the present disclosure.

For example, while the contact via 271 is in contact with the first electrode 220 on the bottom surface of the trench portion 210, this is not limiting. The contact via 271 may be in contact with a flat portion of the first electrode 220, for example. Alternatively, a wire that covers the upper surface of the contact via 271 may be provided, and an end portion of the wire may be in contact with the first electrode 220 on the side surface of the trench portion 210. That is, a contact plug to be electrically connected to the trench portion 210 may include a contact via and a wire.

The dielectric layer 240 may not include the non-overlapping portion 241, for example. In this case, the non-overlapping portion 231 of the second electrode 230 is provided on the upper surface of the lower insulating layer 283*a*. The insulating layer 260 may not include the non-overlapping portion 261. In this case, the non-overlapping portion 251 of the third electrode 250 is provided on the upper surface of the lower insulating layer 283*a*.

The dielectric layer 240 is not limited to a thin film formed using a high-k material, and may be an insulating film such as a silicon oxide film or a silicon nitride film, for example.

The semiconductor device according to the present disclosure may be provided in a storage device that includes a memory array, rather than in an imaging device, for example.

A variety of changes, replacements, additions, omissions, etc. may be made to each embodiment described above within the scope of the claims and equivalents thereof.

The present disclosure can be used for image sensors, digital cameras, medical cameras, robot cameras, security cameras, in-vehicle cameras, etc., for example.

What is claimed is:

1. A semiconductor device comprising:
   a first capacitor element that includes a first electrode, a second electrode, and a dielectric layer positioned between the first electrode and the second electrode; and
   a second capacitor element that includes a third electrode and an insulating layer positioned between the second electrode and the third electrode, wherein
   the first capacitor element includes at least one first trench portion,
   the first electrode, the second electrode, and the third electrode are stacked on each other in this order,
   at least a part of the first electrode, at least a part of the second electrode, and at least a part of the third electrode overlap each other in a plan view,
   the dielectric layer includes a first non-overlapping portion that does not overlap the first electrode in the plan view,
   the insulating layer includes a second non-overlapping portion that does not overlap the second electrode in the plan view, and
   the first non-overlapping portion is positioned at the same height as the second non-overlapping portion in a thickness direction of the semiconductor device.

2. The semiconductor device according to claim 1, further comprising
   a first contact plug connected to the first electrode in the at least one first trench portion.

3. The semiconductor device according to claim 1, wherein
   the first electrode includes two surfaces, and
   one of the two surfaces that is closer to the dielectric layer is entirely covered by the dielectric layer.

4. The semiconductor device according to claim 1, wherein a permittivity of the dielectric layer is higher than a permittivity of the insulating layer.

5. The semiconductor device according to claim 1, further comprising
   a coating insulating film that covers the second capacitor element,
   wherein a permittivity of the insulating layer is higher than a permittivity of the coating insulating film.

6. The semiconductor device according to claim 1, wherein the second capacitor element includes the second electrode.

7. The semiconductor device according to claim 1, wherein the second capacitor element further includes a fourth electrode positioned between the second electrode and the insulating layer.

8. The semiconductor device according to claim 1, wherein the first electrode is electrically connected to the third electrode.

9. The semiconductor device according to claim 1, wherein no potential is supplied to the second electrode.

10. The semiconductor device according to claim 1, wherein the first electrode is not electrically connected to the third electrode.

11. The semiconductor device according to claim 1, wherein the second capacitor element includes at least one second trench portion.

12. The semiconductor device according to claim 11, wherein the at least one first trench portion overlaps the at least one second trench portion in the plan view.

13. An imaging device comprising:
    the semiconductor device according to claim 1.

14. A semiconductor device comprising:
    a first capacitor element that includes a first electrode, a second electrode, and a dielectric layer positioned between the first electrode and the second electrode; and
    a second capacitor element that includes a third electrode and an insulating layer positioned between the second electrode and the third electrode, wherein
    the first capacitor element includes at least one first trench portion,
    the first electrode, the second electrode, and the third electrode are stacked on each other in this order,
    at least a part of the first electrode, at least a part of the second electrode, and at least a part of the third electrode overlap each other in a plan view,
    the second electrode includes a third non-overlapping portion that does not overlap either of the insulating layer and the third electrode in the plan view,
    the third electrode includes a fourth non-overlapping portion that does not overlap any of the first electrode, the dielectric layer, and the second electrode in the plan view, and
    the third non-overlapping portion is positioned at the same height as the fourth non-overlapping portion in a thickness direction of the semiconductor device.

15. The semiconductor device according to claim 14, further comprising:
    a second contact plug connected to the second electrode at the third non-overlapping portion; and
    a third contact plug connected to the third electrode at the fourth non-overlapping portion.

16. A semiconductor device comprising:
    a first capacitor element that includes a first electrode, a second electrode, and a dielectric layer positioned between the first electrode and the second electrode;
    a second capacitor element that includes a third electrode and an insulating layer positioned between the second electrode and the third electrode; and
    a second contact plug, wherein
    the first capacitor element includes at least one first trench portion,
    the first electrode, the second electrode, and the third electrode are stacked on each other in this order,
    at least a part of the first electrode, at least a part of the second electrode, and at least a part of the third electrode overlap each other in a plan view,
    the second electrode includes a third non-overlapping portion that does not overlap either of the insulating layer and the third electrode in the plan view,
    the second contact plug is connected to the second electrode at the third non-overlapping portion, and
    the second contact plug penetrates the third non-overlapping portion, or the third contact plug penetrates the fourth non-overlapping portion.

\* \* \* \* \*